United States Patent [19]

Yoshimura

[11] 4,284,967

[45] Aug. 18, 1981

[54] WAVEGUIDE DEVICE

[75] Inventor: Yoshikazu Yoshimura, Takatsuki, Japan

[73] Assignee: Matsushita Electric Industrial Co., Ltd., Osaka, Japan

[21] Appl. No.: 76,578

[22] Filed: Sep. 18, 1979

[30] Foreign Application Priority Data

Sep. 22, 1978 [JP] Japan .................. 53-117292

[51] Int. Cl.³ .................. H01P 3/123; H01P 1/00; H01P 11/00
[52] U.S. Cl. .................. 333/248; 333/33; 333/218

[58] Field of Search .................. 333/208–212, 333/245, 247, 248, 250, 33–35, 21 R, 21 A, 239, 263, 218; 331/96, 107 G, 117 D; 330/53, 56, 57, 286–287; 363/157–159

[56] References Cited

U.S. PATENT DOCUMENTS

| 3,646,357 | 2/1972 | Grace | 330/287 X |
| 4,122,406 | 10/1978 | Salzburg | 333/21 A |

Primary Examiner—Marvin L. Nussbaum
Attorney, Agent, or Firm—Spencer & Kaye

[57] ABSTRACT

A waveguide device having a ridge conductor which is provided on one of the H-plane walls of a rectangular waveguide, a part of the ridge conductor extending towards the other H-plane wall to come into contact therewith, thus making up a reactance element.

8 Claims, 7 Drawing Figures

F I G. 3a
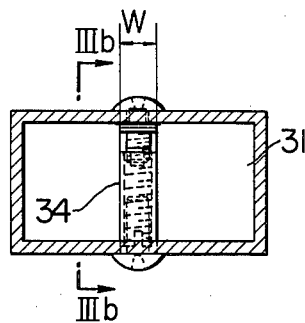
F I G. 3b
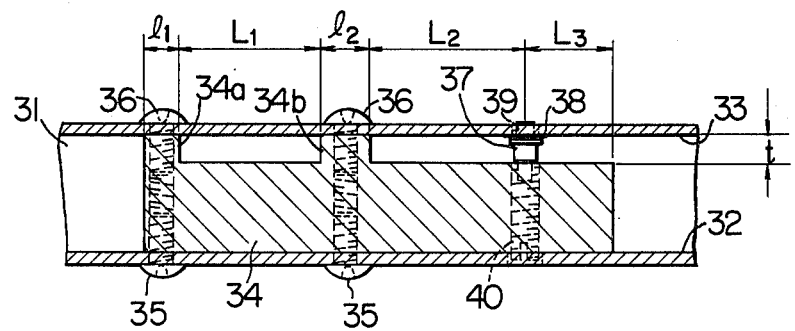
F I G. 3c
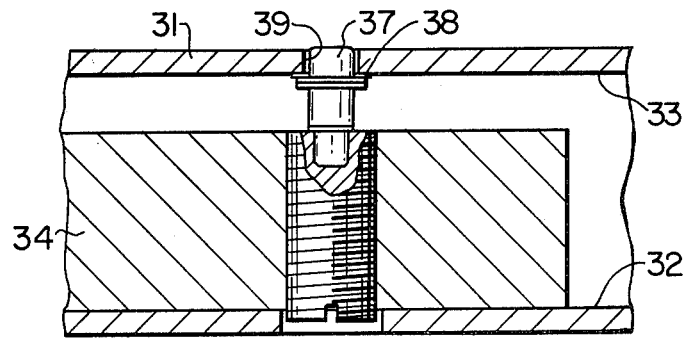

WAVEGUIDE DEVICE

The present invention relates to a rectangular waveguide having a ridge conductor. In a distributed constant circuit such as a waveguide circuit, it is often necessary to provide a circuit element offering a reactance at least at one point of the circuit. A band-pass filter circuit, for instance, requires reactance elements according to the number of stages. Even in a circuit including semiconductor nonlinear elements such as a frequency converter circuit, reactance elements are often required in consideration of the frequency characteristics. Such a reactance element is realized by inserting a member made of a conductive or dielectric material in a transmission path such as a waveguide. The member offers a reactance represented by the position and size of the member, as well known from waveguide theory.

A ridge waveguide circuit, i.e., a rectangular waveguide circuit having a ridge conductor is in many cases used to reduce the characteristic impedance of the rectangular waveguide or the cut-off frequency thereof. In a case where a semiconductor element which exhibits a comparatively small impedance during operation is provided in the waveguide circuit, for instance, a ridge waveguide is used to obtain a reduced characteristic impedance in order to facilitate impedance matching between the semiconductor element and the circuit. In such a case, the above-mentioned reactance element is often used.

The object, feature and advantages of the present invention are explained in conjunction with the following accompanying drawings.

Figure 1A:
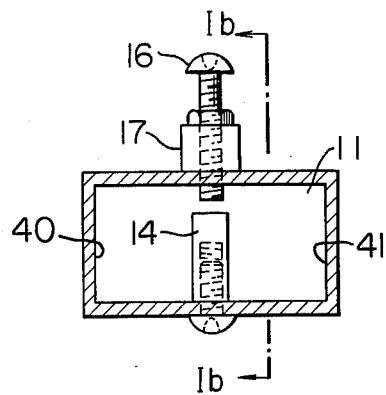
Figure 1B:
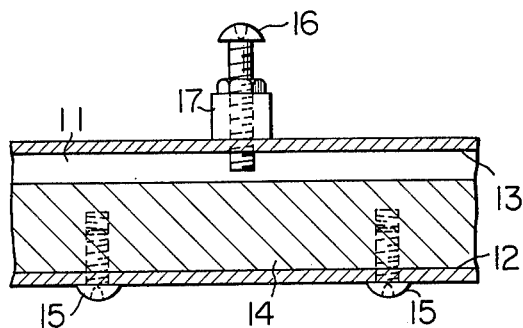
Figure 2A:
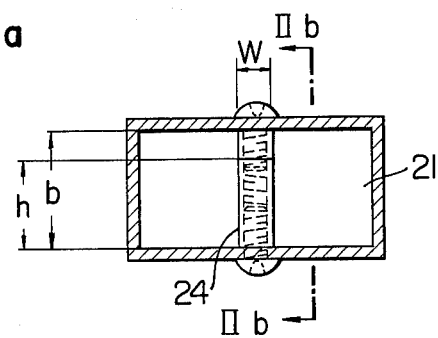
Figure 2B:
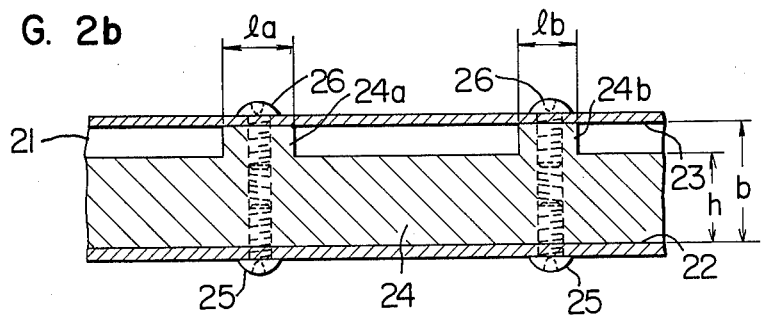

FIGS. 1a and 1b show a front view, and a sectional view taken along the line Ib—Ib of FIG. 1a of a conventional ridge waveguide circuit respectively;

FIGS. 2a and 2b are a front view, and a sectional view taken along the line IIb—IIb of FIG. 2a respectively of a ridge waveguide circuit according to a first embodiment of the present invention; and FIGS. 3a and 3b are a front view, and a sectional view taken along the line IIIb—IIIb of FIG. 3a of a ridge waveguide circuit according to a second embodiment of the present invention respectively, and FIG. 3c is an enlarged sectional view of the part securing a semiconductor element of FIGS. 3a and 3b.

Reference is made to FIGS. 1a and 1b showing a front view and a sectional view of a conventional ridge waveguide circuit. FIG. 1b is taken along the line Ib—Ib of FIG. 1a. A ridge conductor 14 is secured closely to one of the H-plane inner walls 12, 13 of the rectangular waveguide 11 by small screws 15, the H-plane walls being separated by a pair of opposed E-plane inner walls 40, 41. A member 16 offering a reactance as mentioned above is screwed into the ridge waveguide by way of a support 17 arranged on the waveguide wall. This conventional waveguide circuit requires the support 17, and the small screws 15 for securing the ridge conductor 14 to the H-plane inner wall 12, thus complicating the machining process. Further, the support 17 arranged on the outside of the waveguide sometimes offers an obstacle in layout or to assembly work for incorporating the waveguide circuit into an apparatus.

The object of the present invention is therefore to obviate the above-mentioned disadvantages of the conventional ridge waveguide and to provide a compact and simple waveguide. The embodiments of the present invention will be described below with reference to the accompanying drawings.

A front view and a sectional view taken along the line IIb—IIb of FIG. 2a of the first embodiment of the present invention are shown in FIGS. 2a and 2b respectively. One edge of the ridge conductor 24 is secured closely to the H-plane inner wall 22 of the rectangular waveguide 21 by small screws 25. The parts 24a and 24b of the ridge conductor 24 are raised to the height h=b, being the length of the narrower side of the rectangular waveguide so that the ridge conductor 24 is brought into contact with the other H-plane inner wall 23 of the rectangular waveguide. In this way, the parts 24a and 24b of the ridge conductor 24 are closely secured to the H-plane inner wall 23 by small screws 26. It is of course necessary to previously provide the conductor 24 with female sockets to mate or engage with the small screws 25 and 26.

It is apparent that the parts 24a and 24b of the ridge conductor 24 function as a reactance on the ridge waveguide according to transmission line theory as mentioned above. The magnitude of the reactance depends on the width W of the ridge conductor (FIG. 2a) and on the lengths la and lb of the parts 24a and 24b of the ridge conductor (FIG. 2b). When a selected value of the width W of the ridge conductor is employed, the magnitude of the reactance is determined by the lengths la and lb of the parts 24a and 24b of the ridge conductor. The greater the values la and lb, the larger the magnitude of the reactance becomes.

Next, the second embodiment of the present invention is shown in FIGS. 3a and 3b, which are respectively a front view and a sectional view along line IIIb—IIIb.

The parts 34a and 34b offering a reactance of the ridge conductor 34 closely secured to one of the H-plane inner walls 32 of the rectangular waveguide 31 by small screws 35 are closely secured to the other H-plane inner wall 33 by small screws 36. A semiconductor nonlinear element 37 for frequency conversion is mounted through a cylindrical conductor 40 screwed into the ridge conductor 34. The terminal electrode of the semiconductor nonlinear element 37 which is opposed to the H-plane inner wall 33 is electrically insulated from the H-plane inner wall 33 by an insulating film 38, film 38 being thin enough to sufficiently reduce the amount of electromagnetic field which leaks out of the waveguide. The circuit according to this embodiment makes up a frequency converter circuit using a ridge waveguide circuit. In the case of a frequency shift down converter, for example, the left part of FIG. 3b forms a local oscillation input section, the right part thereof a signal input section, and the small hole 39 formed in the H-plane wall an intermediate frequency output section. In FIG. 3b, the values of L1, L2, L3, l1 and l2 are experimentally determined so that the locally oscillated power from the left side is efficiently applied to the semiconductor nonlinear element 37 and so that the signal power from the right side is efficiently applied to the semiconductor nonlinear element 37 and the leakage to the local oscillator section on the left side is minimized. As a result, the relations $L_1 \approx \lambda_L/2$, $L_2 \approx \lambda_S/2$ and $L_3 \approx \lambda_S/4$ are maintained where $\lambda_L$ is the wavelength in the ridge waveguide corresponding to the local oscillation frequency, and $\lambda_S$ the wavelength in the ridge waveguide corresponding to the signal frequency. If the sizes of respective parts are determined as mentioned above, the local oscillation power from the left side in FIG. 3b and the signal power from the right side are efficiently applied to the semiconductor nonlinear element 37, so that the frequency difference therebetween; i.e., an intermediate frequency output is taken out of the waveguide through the small hole 39.

The following parameters are typical of an actual device:

Inner size of waveguide: 19.05 mm × 9.525 mm
Size of ridge conductor:
  W = 3 mm
  t = 2.5 mm
  l1 = 2.6 mm
  l2 = 4.0 mm
  L1 = 11.8 mm
  L2 = 13.6 mm
  L3 = 5.6 mm
Signal frequency: $f_S$ = 11.95 to 12.13 GHz
Local oscillation frequency: $f_L$ = 11.660 GHz
Intermediate frequency: $f_{if}$ = 290 to 470 MHz
Conversion diode 37: GaAs Schottky barrier diode ISS89 made by Matsushita Electronics Co.
Conversion loss: 3.0 to 3.5 dB In the above-mentioned two embodiments, a small screw member for fine adjustment of the magnitude of the reactances offered by the parts 24a, 24b or 34a, 34b may be provided on the wall of the waveguide.

As understood from the foregoing embodiments, parts of the ridge conductor are shaped to come into contact with the H-plane inner walls of the rectangular waveguide to offer a reactance as an element of the waveguide circuit. Thus the ridge conductor is integral with the parts offering the reactance, thereby eliminating the conventional structure wherein the reactance-offering parts are inserted into the inner space of the waveguide through the wall of the waveguide, which in turn eliminates the support of the reactance member on the outside of the waveguide. Instead, it is only necessary according to the invention to intimately secure the ridge conductor to the inner wall of the waveguide, thus avoiding an otherwise complicated machining or fabricating process. Further, several obstacles which could be posed by the support of the reactance member in arranging the conventional waveguide in a particular apparatus are dispensed with in integrating the waveguide of the present invention into such an apparatus, thus realizing a compact and simple waveguide device having great industrial value.

What is claimed is:

1. A waveguide device comprising a rectangular waveguide including a pair of opposed H-plane inner walls and a pair of opposed E-plane inner walls, and a ridge conductor mounted on one of said H-plane inner walls, said ridge conductor being parallel to the electric field of the fundamental mode of said waveguide and having at least one integral portion extending therefrom in contact with the other H-plane inner wall, whereby said ridge conductor functions as a reactance element.

2. A waveguide device according to claim 1, wherein a semiconductor nonlinear element is mounted on said ridge semiconductor thus making up a frequency converter circuit.

3. A waveguide device according to claim 1 or 2, wherein a plurality of said integral portions of said ridge conductor are extended to be in contact with the other H-plane wall.

4. A waveguide device comprising:
   a first and second opposing parallel H-plane walls extending in a longitudinal direction, said H-plane walls being uniformly spaced along their entire length;
   first and second opposing parallel E-plane walls extending in said longitudinal direction, said E-plane walls being uniformly spaced along their entire length and positioned perpendicular to said H-plane walls to form a rectangular waveguide; and
   a ridge conductor positioned within said rectangular waveguide between and spaced from said E-plane walls and extending parallel thereto in said longitudinal direction, said ridge conductor having a first edge in contact with said first H-plane wall along its entire length and a second edge in contact with said second H-plane wall at at least two fixed predetermined locations, the second edge of said ridge conductor being uniformly spaced from said second H-plane wall except at said predetermined locations.

5. A waveguide device according to claim 4 wherein said ridge conductor is secured to said first and second H-plane walls by screws, the screws affixing said ridge conductor to said second H-plane wall being located only at said predetermined locations.

6. A waveguide device according to claim 4 or 5 which further comprises a semiconductor nonlinear element interposed between said second H-plane wall and the second edge of said ridge conductor.

7. A waveguide device according to claim 6 which further comprises an insulating member interposed between said semiconductor nonlinear element and said second H-plane wall.

8. A waveguide device according to claim 6 wherein said semiconductor nonlinear element is a diode.

* * * * *